United States Patent [19]

Tseng

[11] Patent Number: 5,434,812
[45] Date of Patent: Jul. 18, 1995

[54] METHOD FOR FABRICATING STACKED CAPACITORS WITH INCREASED CAPACITANCE IN A DRAM CELL

[75] Inventor: Horng-Huei Tseng, Hsinchu,

[73] Assignee: Industrial Technology Research Institute, Hsinchu, Taiwan

[21] Appl. No.: 251,756

[22] Filed: May 31, 1994

Related U.S. Application Data

[62] Division of Ser. No. 951,794, Sep. 28, 1992, Pat. No. 5,330,928.

[51] Int. Cl.⁶ .............................................. G11C 11/24
[52] U.S. Cl. .................................. 365/149; 257/300; 257/302; 257/303; 257/306
[58] Field of Search ............... 257/300, 301, 302, 303, 257/306; 365/149

[56] References Cited

U.S. PATENT DOCUMENTS

| | | | |
|---|---|---|---|
| 4,700,457 | 10/1987 | Matsukawa | 437/52 |
| 4,742,018 | 5/1988 | Kimura et al. | 437/48 |
| 4,910,566 | 3/1990 | Ema | 357/23.6 |
| 5,216,267 | 6/1993 | Jin et al. | 257/306 |

OTHER PUBLICATIONS

"Are You Ready for Next-Generation Dynamic RAM Chips?" by F. Masuoka pp. 109-112, IEEE Spectrum, Nov. 1990.
T. Ema et al, "3 Dimensional Stalked Capacitor Cell For 16M and 64M DRAMS" IEDM 1988 pp. 592-595.

*Primary Examiner*—Joseph A. Popek
*Assistant Examiner*—F. Niranjan
*Attorney, Agent, or Firm*—George O. Saile

[57] ABSTRACT

A method is described for fabricating a dynamic random access memory having a high capacitance stacked capacitor. Relatively thick field oxide areas are selectively formed on the surface of a semiconductor substrate while leaving device areas for fabrication of field effect devices. Gate structures and associated source/drain structures are formed within the device areas. A first silicon oxide layer is formed over the device and field oxide areas. The stacked capacitors are now formed by first depositing a thick second polysilicon layer oven the device and field oxide areas. Openings are formed to the desired source/drain structures by etching through the second oxide, second polysilicon, and first oxide layers. Cavities are formed between the first and second oxide layers by laterally etching the second polysilicon layer. A third polysilicon layer is deposited over the device and field oxide areas. The second and third polysilicon layers and the first and second oxide layers are patterned so as to have their remaining portions over the planned capacitor areas. The layers are etched leaving the third polysilicon layer as the bottom storage node electrode contacting the source/drain structures. The remaining second and third polysilicon layers form the storage node of the capacitor. A capacitor dielectric layer is formed over the bottom electrode polysilicon layer. A contact polysilicon layer is deposited as the top plate electrode and the contact polysilicon layer and the dielectric layer are patterned to complete the stacked capacitor.

6 Claims, 7 Drawing Sheets

METHOD FOR FABRICATING STACKED CAPACITORS WITH INCREASED CAPACITANCE IN A DRAM CELL

This is a divisional of application Ser. No. 07/951794, filed on Sep. 28, 1992 now U.S. Pat. No. 5,330,928.

RELATED PATENT APPLICATIONS (1) U.S. Pat. No. 5,192,702, "A Self-Aligned Cylindrical StackedCapacitor DRAM Cell to H. H. Tseng, Mar. 9, 1993".

(2) U.S. patent application Ser. No. 07/811,537 filed Dec. 20, 1991 by the same inventor H. H. Tseng entitled "Dynamic Random Access Memory With Fin-Type Stacked Capacitor"

(3) U.S. Pat. No. 5,126,916, "A STACKED CAPACITOR DRAM CELL AND METHOD OF FABRICATING," to H. H. Tseng, Jun. 30, 1992.

BACKGROUND OF THE INVENTION

(1) FIELD OF THE INVENTION

The present invention relates to methods of fabricating a dynamic random access memory having a high capacitance stacked capacitor.

(2) DESCRIPTION OF THE PRIOR ART

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lowering source/drain ratio and undesirable signal problems. In order to achieve the desired higher level of integration, the technology must keep almost the same storage capacitance on a greatly reduced cell area.

Efforts to maintain or increase the storage capacitance in memory cells with greater packing densities in the fabrication of stacked capacitors are evident in T. Ema U.S. Pat No. 4,910,566: S. Kimura et al U.S. Pat. No. 4,742,018 and T. Matsukawa U.S. Pat. No. 4,700,457. The publications "Are you ready for next-generation dynamic RAM chips?" by F. Masuoka pages 109-112, IEEE Spectrum, November 1990, and T. Ema et al "3-DIMENSIONAL STACKED CAPACITOR CELL FOR 16M AND 64M DRAMS" IEDM 1988 pages 592-595 describe the problems and possible types capacitor structures for future generations of dynamic RAMs. Another approach to achieve sufficient capacitance in high density memories is the use of a stacked trench capacitor cell as described in the pending US patent application of Wen Doe Su entitled "FABRICATION OF MEMORY CELL WITH AN IMPROVED CAPACITOR" Ser. No. 07/568,945 filed Aug. 17, 1990.

One of the primary goals in the art of integrated circuit manufacture is increasing the number of devices that can be placed into a given unit space on the semiconductor chip. As the traditional fabrication process begins to approach the limits of reduction, considerable attention has been applied to forming device elements on over and above the wafer to take advantage of the extra versatility of the third dimension.

One of the successful vertically oriented integrated circuit devices is the stacked capacitor. Briefly, such a stacked capacitor is formed by forming the stacked capacitor structures laying over the gate electrode on active and field oxide regions and diffusion region. The processing of such structures has become very complicated and requires lithography and etching steps which are not in step with the very small dimensions required in the present and future state of the art. Although there has been much work done in accomplishing these small size devices and increased capacitance therein, there is still great need for devices with even greater capacitance for a given space in order to achieve even greater packing densities, and improve the DRAM products of the future.

SUMMARY OF THE INVENTION

Accordingly, it is a primary object of the invention to provide a process for producing a memory cell and resulting structure with a stacked capacitor having greater capacitance per unit area and by a very manufacturable process.

A method is described for fabricating a dynamic random access memory having a high capacitance stacked capacitor. The method begins by selectively forming relatively thick field oxide areas on the surface of a semiconductor substrate while leaving device areas for fabrication of field effect devices. A gate dielectric layer is formed on the substrate in the device areas. A relatively thick first layer of polysilicon is deposited on the field oxide areas and the device areas. Portions of the first polysilicon layer are removed while leaving portions thereof for the gate structure in the device areas, and portions over the field oxide areas. Source/drain structures are formed within the device areas of the semiconductor substrate associated with the gate structures. A first silicon oxide layer is formed over the device and field oxide areas. The stacked capacitors are now formed by first depositing a thick second polysilicon layer over the device and field oxide areas. Openings are formed to the desired source/drain structures by etching through the second oxide, second polysilicon, and first oxide layers. Cavities are formed between the first and second oxide layers. A third polysilicon layer is deposited over the device and field oxide areas. The second and third polysilicon layers and the first and second oxide layers are patterned so as to have their remaining portions over the planned capacitor areas. The layers are etched leaving the third polysilicon layer as the bottom storage node electrode contacting the source/drain structures. The remaining second and third polysilicon layers form the storage node of the capacitor. A capacitor dielectric layer is formed over the bottom electrode polysilicon layer. A contact polysilicon layer is deposited as the top plate electrode and the contact polysilicon layer and the dielectric layer are patterned to complete the stacked capacitor.

A dynamic random access memory having a high capacitance stacked capacitor is described. Relatively thick field oxide areas are located on the surface of a semiconductor substrate which surround device areas for fabrication of field effect devices. Gate dielectric and electrode structures are on the substrate in the device areas. Interconnecting lines composed of polysilicon layers are located over the field oxide areas. Source/drain structures are within the device areas of the semiconductor substrate associated with the gate structures. The stacked capacitor structure is constructed of layers of polysilicon forming the storage node of the capacitor which has portions based upon the gate electrode and interconnection line structures. A lower electrode completing polysilicon layer is formed over the surfaces of the polysilicon layers electrically contacting the source/drain structures. A capacitor dielectric layer is formed over the lower electrode of the stacked capacitor. A top polysilicon electrode layer completes the stacked capacitor.

BRIEF DESCRIPTION OF THE DRAWINGS

In the following drawings forming a material part of this description, there is shown.

DESCRIPTION OF THE PREFERRED EMBODIMENTS

Figure 1:
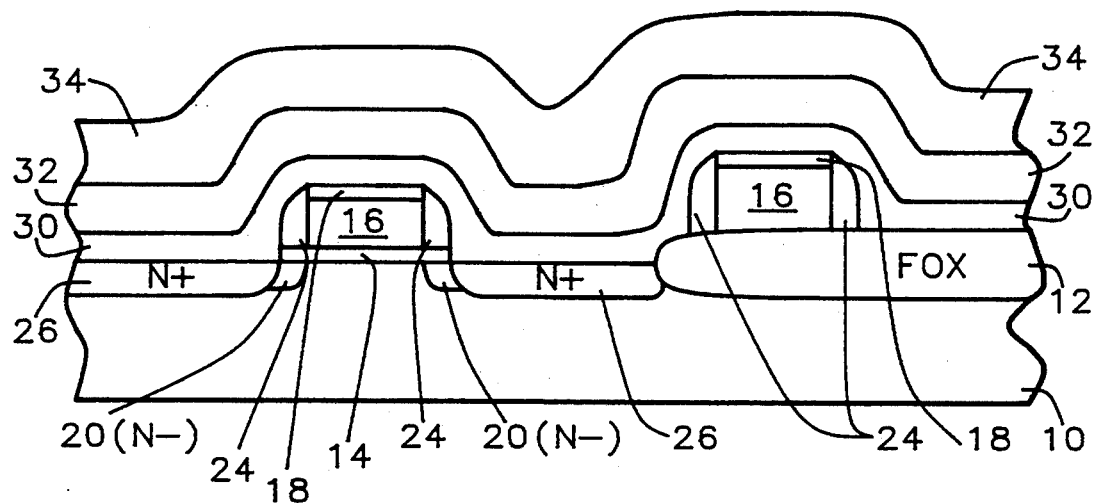
FIGS. 1, 2A, 2B and 3 through 5 are schematic cross-sectional representations of one embodiment method for fabricating a stacked capacitor in combination with a field effect device which is usable in a DRAM cell.

Referring now more particularly to FIGS. 1 through 5 there is shown an embodiment of the method for fabricating a self-aligned, stacked capacitor and field effect device structure. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 12. Then semiconductor devices can be provided in the silicon mesas according to the following processes.

The surface of the silicon substrate 10 is thermally oxidized to form the desired gate oxide 14 thickness. The preferred thickness is between about 80 to 200 Angstroms. The polysilicon layer 16 is blanket deposited by LPCVD (Low Pressure Chemical Vapor Deposition) method. The preferred thickness of the first polysilicon layer 16 is between about 1500 to 3000 Angstroms. The polysilicon layer 16 is ion implanted with phosphorus or arsenic ions under the conditions 5 to 10 E 15 dosage per area and 20 to 60 Kev or doped with phosphorus oxychloride at a temperature of about 900° C. A surface silicon oxide or glass layer 18 is formed on the polysilicon layer 16. The layers 14, 16 and 18 are patterned by conventional lithography and anisotropic etching techniques as are conventional in the art to provide a desired pattern of gate electrodes and interconnection runners on the FOX 12 surfaces or elsewhere as seen in FIG. 1.

The source/drain structure of the MOS FET may now be formed by the following steps. FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

FIG. 1, for example shows the ion implantations of N- dopants. Lithographic masks may be required to protect the areas not to be subjected to that particular N- ion implantation. The formation of the lithographic masks are done by conventional lithography and etching techniques. The N- lightly doped drain implantation 20 is done with, for example phosphorous P31 at a dose of between about 1 to 10 E 13 atoms/cm.$^2$ and with an energy of between about 20 to 40 Kev.

The dielectric spacer 24 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 24 is between about 2000 to 5000 Angstroms and preferably about 2500 Angstroms.

An anisotropic etching of this layer produces the dielectric spacer layer 24 on the sidewalls of the layer structures 14, 16, 18. The preferred anisotropic etching uses a conventional reactive ion etching ambient.

A thin silicon oxide, silicon nitride or the like masking layer (not shown) is usually formed upon the layer structure regions 14, 16, 18, the spacers 24 and the exposed monocrystalline silicon substrate regions to protect the surfaces from ion implantation damage. The conditions for forming this layer are LPCVD deposition of TEOS or LPCVD silicon nitride deposition at about 600° to 900° C. The preferred thickness of this oxide layer is between about 200 to 1000 Angstroms and a preferred thickness of about 600 Angstroms.

The N+ source/drain ion implantation uses Arsenic, As75 with a dose of between about 2 E 15 to 1 E 16 atoms/cm.$^2$ and energy of between about 20 to 70 Kev. to complete the source/drain regions 26 of the N channel lightly doped drain MOS FET integrated circuits device as seen in the FIG. 1.

A first silicon oxide layer 30 is formed over the field oxide and device areas. This layer is formed by low pressure chemical vapor deposition (LPCVD) at a temperature of about 720° C., pressure of 200 to 300 mTorr, and gas of Si(CH$_3$)$_4$, N$_2$O, and oxygen. The thickness of layer 30 is between about 500 to 2000 Angstroms. A second polysilicon layer 32 is deposited by LPCVD in-situ phosphorus doped process at a temperature of about 570° C., pressure of 200 to 300 mTorr, and process gases of (15% PH$_3$ and 85% silane) and (5% PH$_3$ and 95% nitrogen) over oxide layer 30. The thickness of this layer is between about 2000 to 6000 Angstroms. A second layer of silicon oxide 34 is deposited over layer 32, also by LPCVD with the same conditions used for layer 30, but the thickness of layer 34 is between about 2000 to 6000 Angstroms.

Figure 2A:
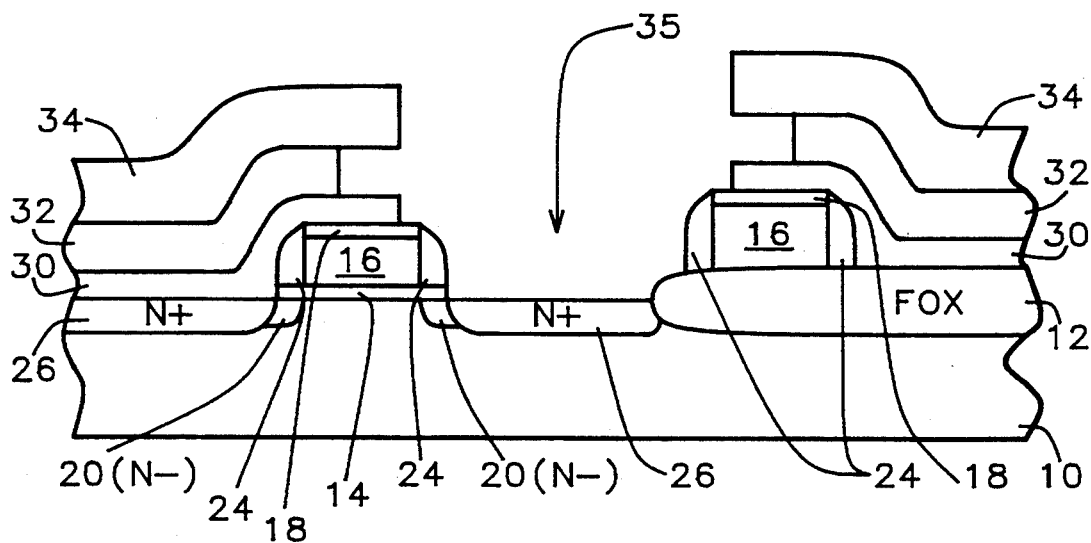
Figure 2B:
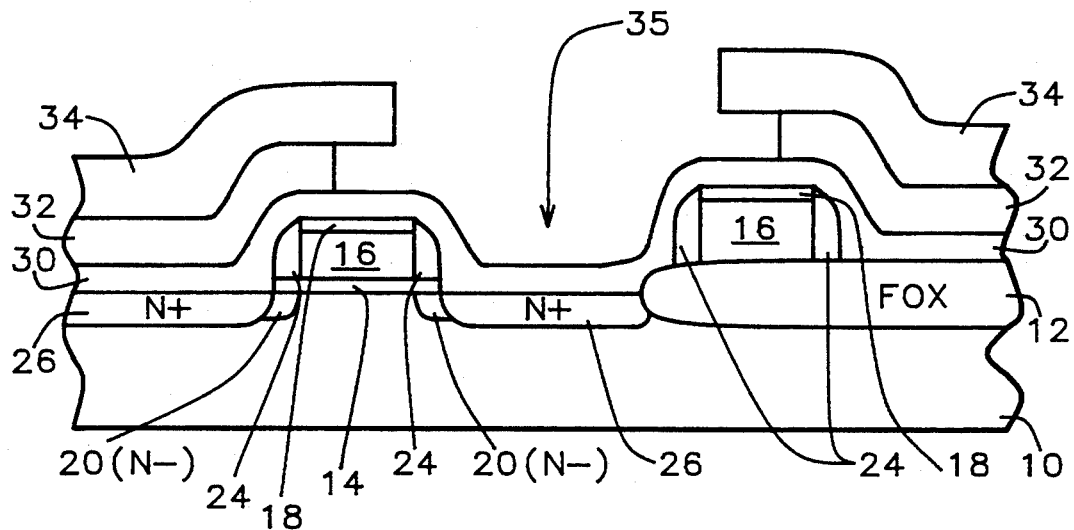

FIGS. 2A and 2B illustrate the results of two different etching approaches used in this embodiment. In the first approach, second oxide layer 34, second polysilicon layer 32, and first oxide layer 30 are anisotropically etched in a multi-chamber etcher. The result is illustrated in FIG. 2A. A phosphoric acid ($H_3PO_4$) solution is used to undercut the polysilicon layer 32, forming cavities between the first and second oxide layers 30 and 34. In this approach, the second polysilicon layer 32 must have been doped, as described above. The phosphoric acid etch stops at the N+source/drain region 26.

In the second approach, the second oxide layer 34 and the second polysilicon layer 32 are anisotropically etched in a multi-chamber etcher. The result is illustrated in FIG. 2B. In this case, the second polysilicon layer 32 can be doped or undoped. A dry isotropic plasma etch consisting of chlorine and hydrogen bromide ($Cl_2$+HBr) or chlorine alone is used to undercut the second polysilicon layer 32, forming cavities between the first and second oxide layers, 30 and 34. The chlorine-based plasma etch or phosphoric acid etch stops at the first oxide layer 30. This oxide layer provides protection for the source/drain region during etching. An anisotropic etch is then used to remove the first oxide layer 30 in the opening 35.

Figure 3:
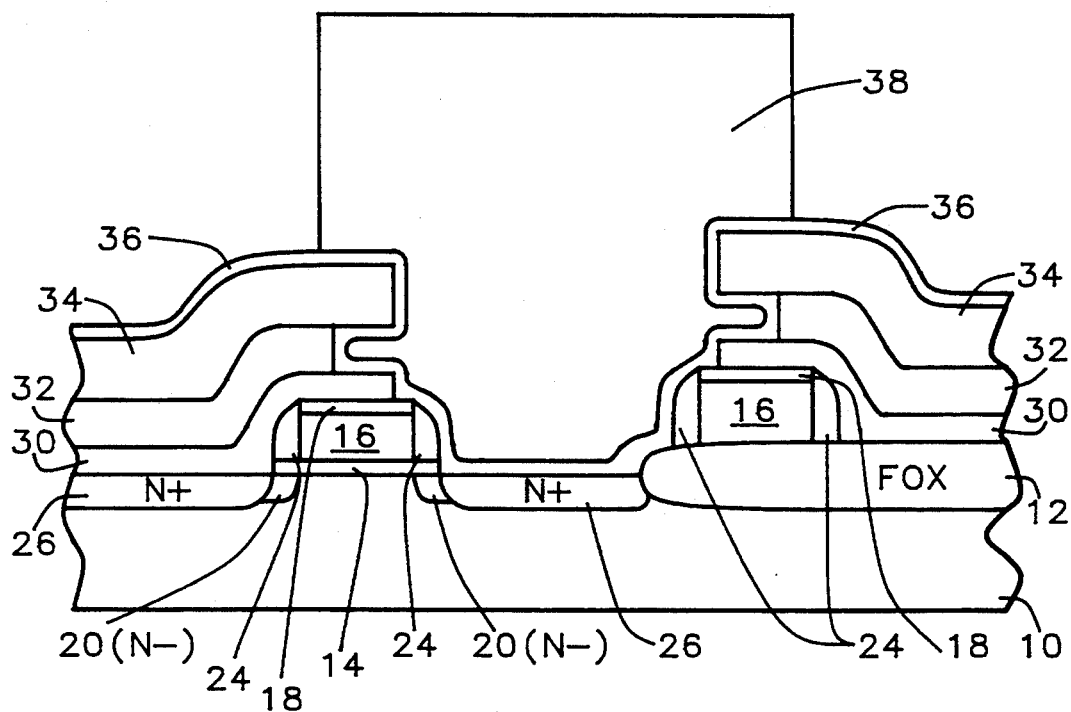

Referring now to FIG. 3, a third layer of polysilicon 36 is deposited over the field oxide and device areas. The layer has a thickness of between about 500 to 2000 Angstroms. It is deposited by LPCVD under the same conditions as described for layer 32. The polysilicon layers 32 and 36 and the oxide layers 30 and 34 are patterned by lithography and etching techniques so as to have their remaining portions over the planned stacked capacitor areas. 38 illustrates the photoresist mask used in the patterning.

Figure 4:
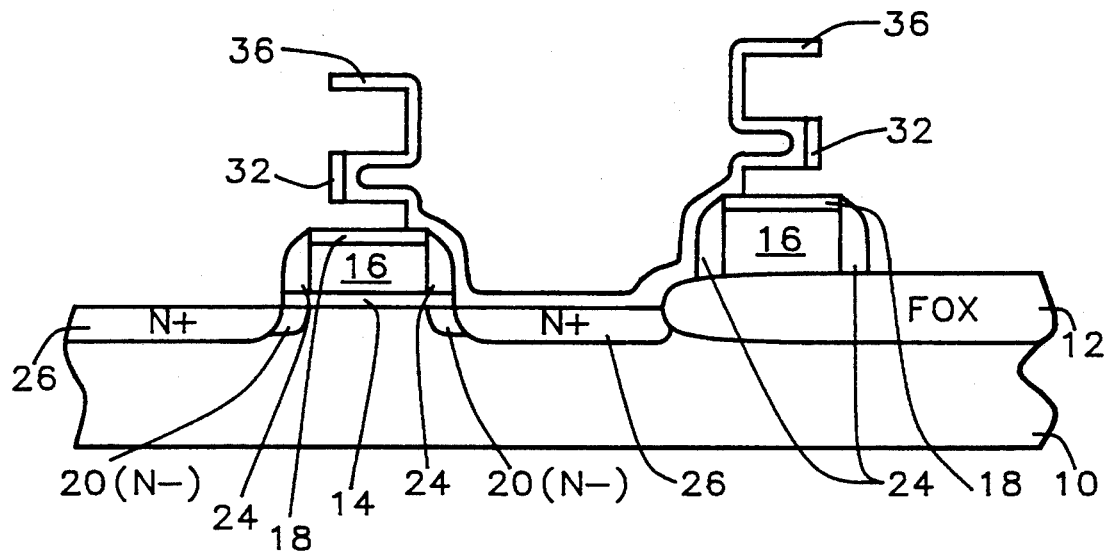

Referring now to FIG. 4, reactive ion etching is performed in a multi-chamber etcher to remove the polysilicon layers 36 and 32 and the oxide layer 34. The etch stop is at the first silicon oxide layer 30. The photoresist is removed. The oxide layers 30 and 34 are removed using a hydrofluoric acid solution. The second and third polysilicon layers remaining 32 and 36 comprise the storage node of the capacitor. The third polysilicon layer 36 contacting the N+ source/drain region 26 forms the bottom electrode of the capacitor.

Figure 5:
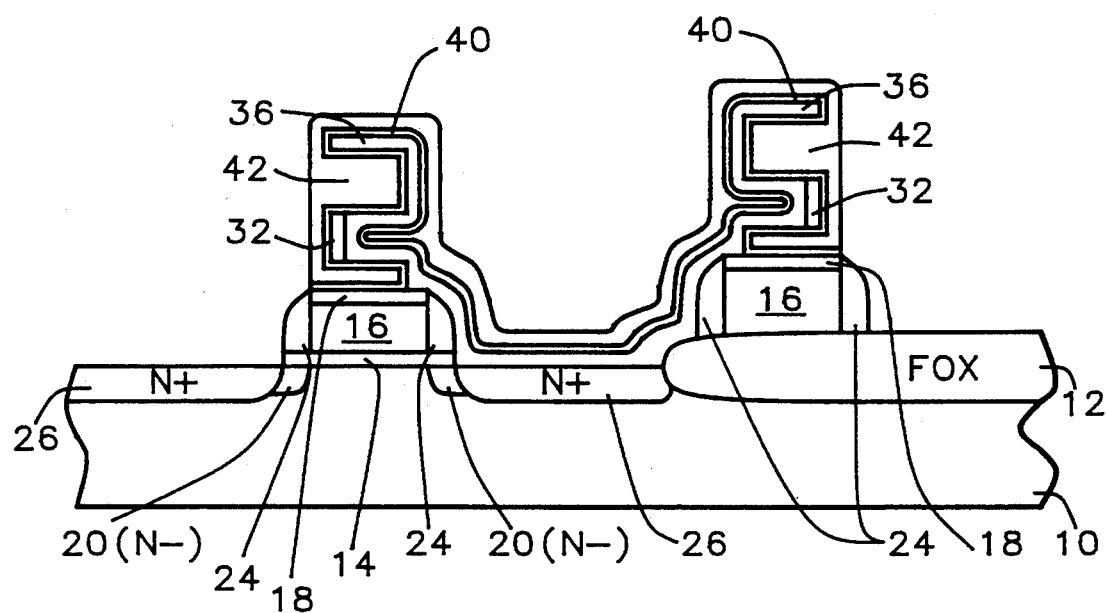

Referring now to FIG. 5, the capacitor dielectric layer 40 is now formed over the polysilicon layers 32 and 36 which form the storage node of the capacitor. The layer is typically either composed of layers of silicon nitride and silicon oxide (NO) or layers of silicon oxide, silicon nitride and silicon oxide (ONO). In making the ONO dielectric, the first or bottom silicon oxide, 0 layer is formed by, for example exposure to deionized water (DI) to form a native silicon oxide or by thermal oxidization of layer 50 in dry oxygen ambient to produce in either case a silicon oxide thickness of about 50 Angstroms. The silicon nitride, N layer is formed by LPCVD wherein the gases are ammonia and $SiH_2Cl_2$, temperature of 760° C., pressure of 350 mTorr., to give a resulting thickness of between about 50 to 70 Angstroms. The top silicon oxide, 0 layer may be formed by exposing the N layer to dry oxygen at about 850° C. for about 30 minutes to form a silicon nitride/oxide layer. The total ONO thickness is in the order of 100 to 200 Angstroms.

The top plate electrode is formed by depositing a fourth polysilicon layer 42 by LPCVD under the same conditions as described for layer 32. The thickness of this layer 42 is between about 1000 to 3000 Angstroms. The layers 40 and 42 are now patterned using conventional lithography and etching techniques to complete construction of the capacitor.

The final structure (not shown) would have another level of electrical connections to the FET and stacked capacitor cell of the DRAM integrated circuit, including electrical contact made to the source/drain region 26 using appropriate metallurgy.

Figure 6:
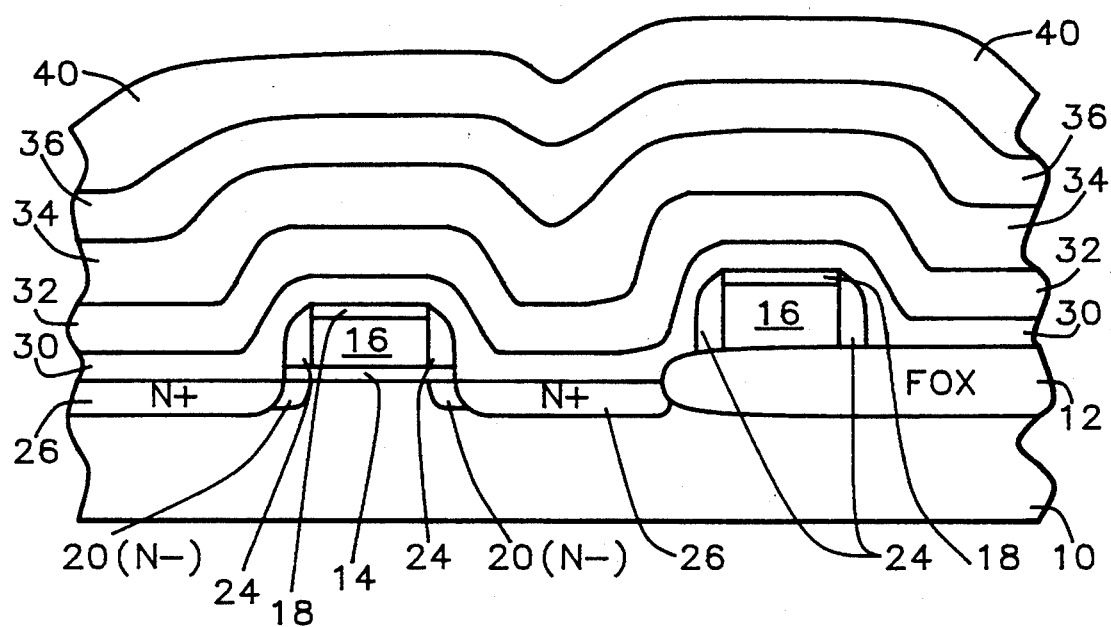
FIGS. 6, 7a, 7b and 8 through 10 are schematic cross-sectional representations of a second embodiment method for fabricating a stacked capacitor in combination with a field effect device which is usable in a DRAM cell.

The second preferred embodiment of the present invention illustrated in FIGS. 6 through 10 includes additional layers of polysilicon and silicon oxide. Referring now to FIG. 6, the transistor gate structures and source/drain regions are formed as described above for FIG. 1. A first silicon oxide layer 30 is deposited by LPCVD over the field oxide and device structures. This layer has a preferred thickness of between about 500 to 2000 Angstroms. A second polysilicon layer 32 is deposited over layer 30 by LPCVD as described in the first preferred embodiment to a thickness of between about 2000 to 6000 Angstroms. A second silicon oxide layer 34 is deposited over layer 32 by LPCVD as described in the first preferred embodiment to a thickness of between about 2000 to 6000 Angstroms. A third polysilicon layer 36 is deposited over layer 34 by LPCVD as described for layer 32 in the first preferred embodiment. A third silicon oxide layer 40 is deposited over layer 36 by LPCVD as described for layer 30 in the first preferred embodiment to a thickness of between about 2000 to 6000 Angstroms.

Figure 7A:
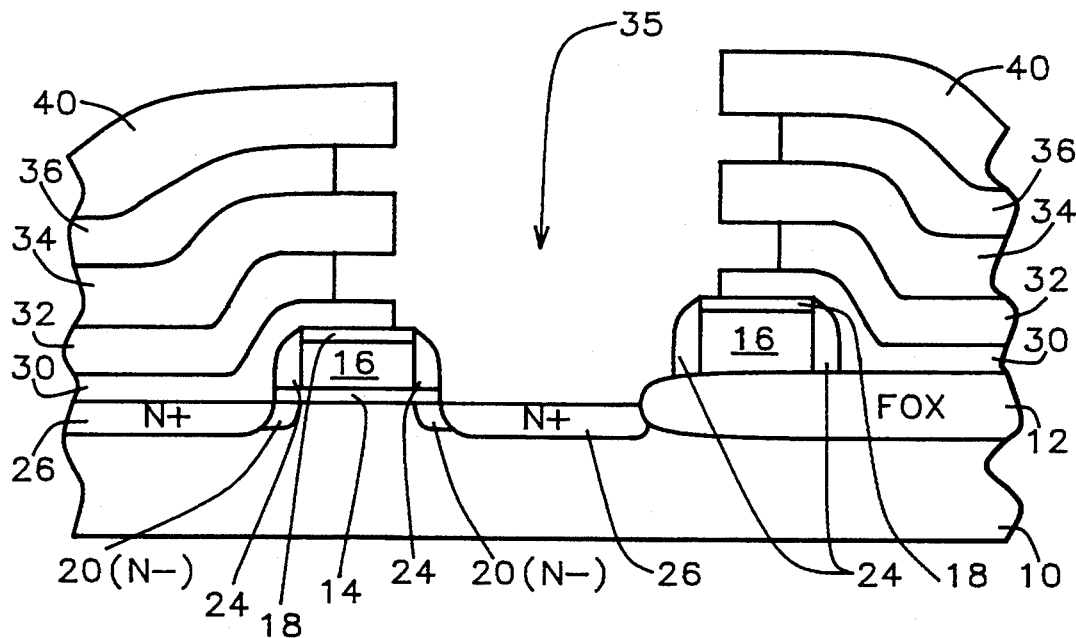
Figure 7B:
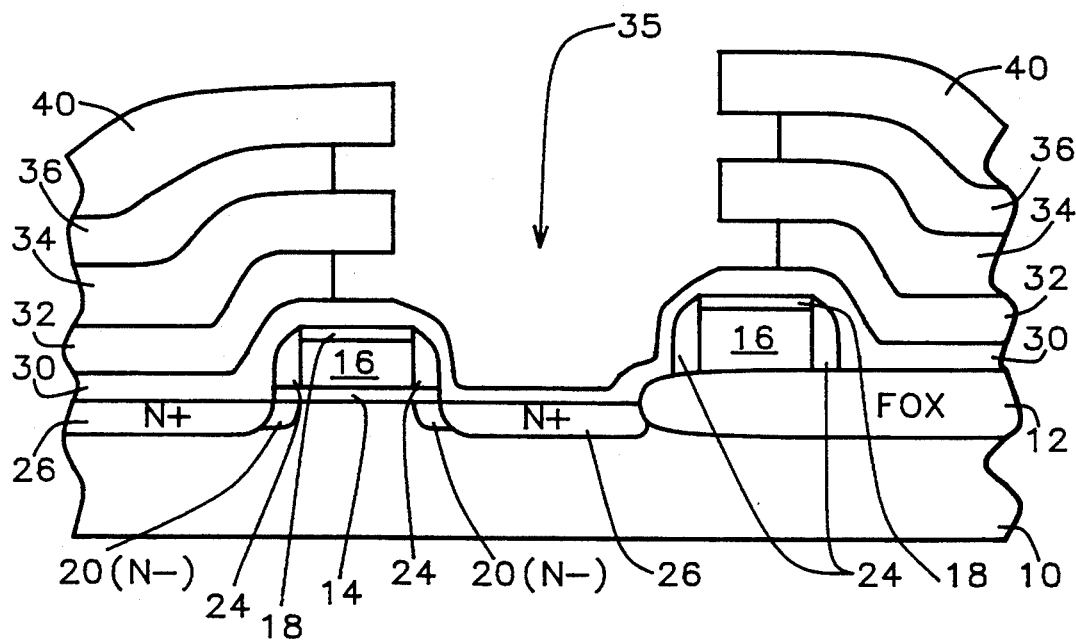

Referring now to FIGS. 7A and 7B, the polysilicon and silicon oxide layers are etched to form opening 35 to the source/drain region 26. The two methods for forming cavities between first oxide layer 30 and second oxide layer 34 and between second oxide layer 34 and third oxide layer 40 are the same as described in the first embodiment.

Figure 8:
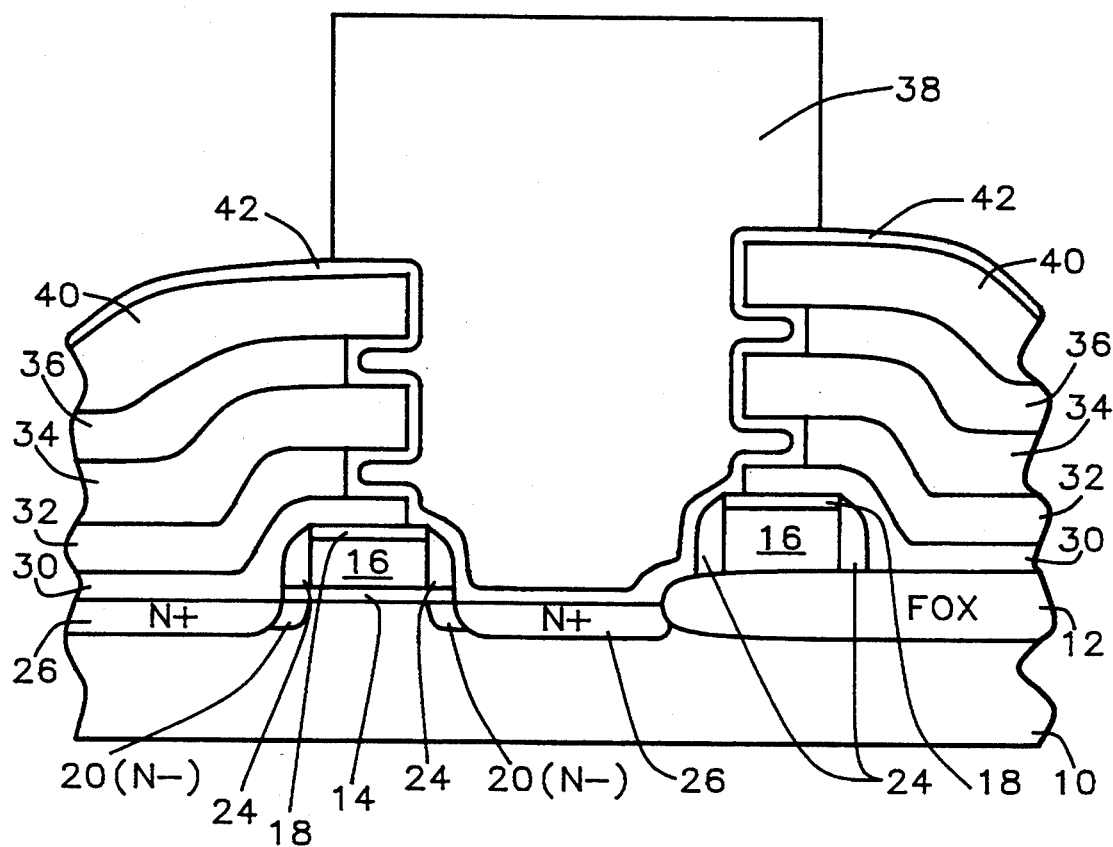

Referring now to FIG. 8, a fourth polysilicon layer 42 is deposited. This is done in the same way as the third polysilicon layer deposition described for FIG. 3. Photoresist mask 38 is used to pattern the layers of polysilicon and silicon oxide.

Figure 9:
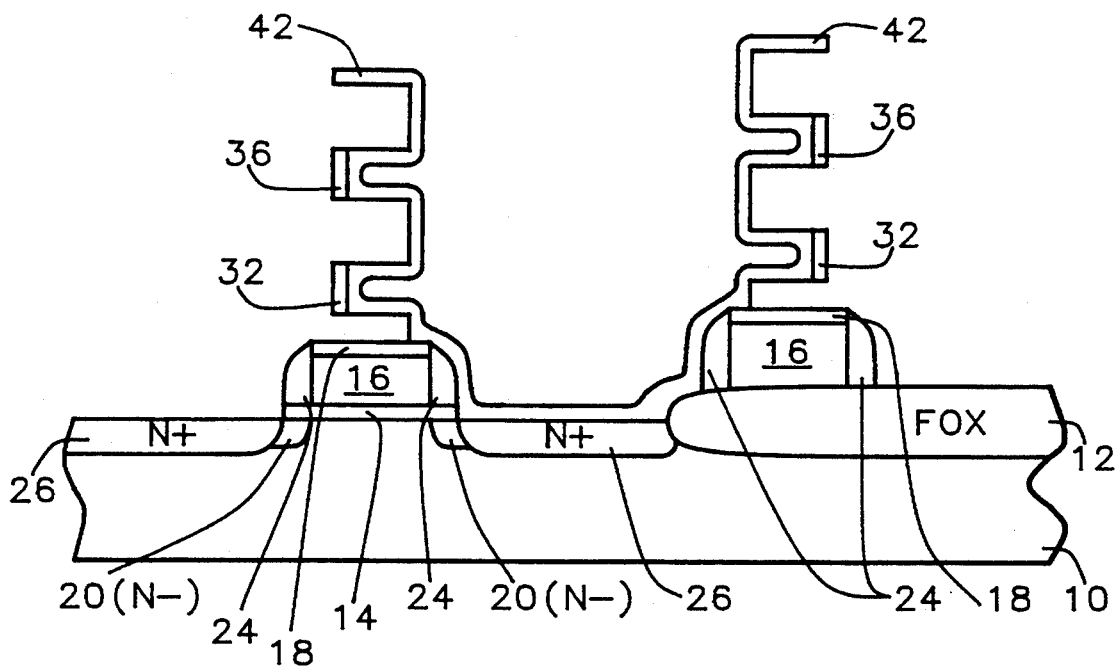

FIG. 9 illustrates the reactive ion etching of the polysilicon layers 32, 36 and 42 and silicon oxide layers 34 and 40 as described for FIG. 4, with the first silicon oxide layer 30 acting as an etch stop. The first, second and third oxide layers 30, 34 and 40 are removed using a hydrofluoric acid solution.

Figure 10:
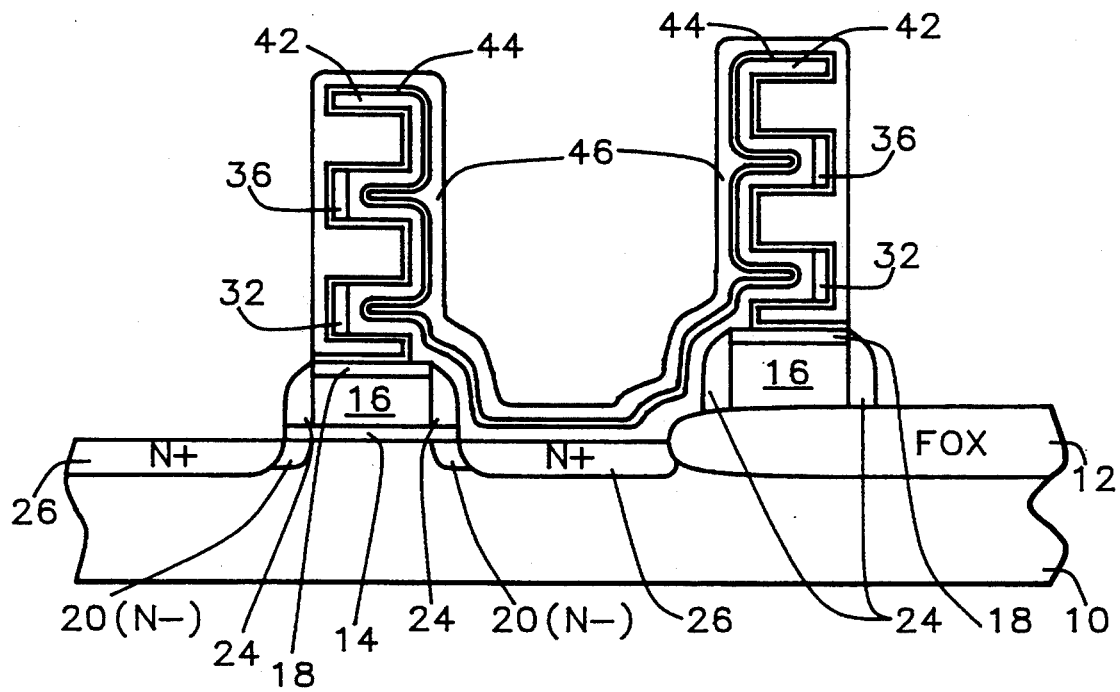

FIG. 10 illustrates the formation of the capacitor dielectric layer 44 as described for FIG. 5 and the deposition and patterning of the fifth polysilicon layer 46 which forms the top electrode of the capacitor. This completes the construction of the capacitor.

The final structure (not shown) would have another level of electrical connections to the FET and stacked capacitor cell of the DRAM integrated circuit including electrical contact made to the source/drain region 26 using appropriate metallurgy.

While the invention has been particularly shown and described with reference to the preferred embodiments thereof, it will be understood by those skilled in the art that various changes in form and details may be made without departing from the spirit and scope of the invention.

What is claimed is:

1. A dynamic random access memory having a high capacitance capacitor comprising:
    relatively thick field oxide areas on the surface of a semiconductor substrate which surround device areas for fabrication of field effect devices;

gate dielectric and electrode structures on said substrate in the said device areas;

an interconnecting line composed of polysilicon layer over said field oxide areas;

source/drain structures within said device areas of said semiconductor substrate associated with said gate structures;

and said capacitor structure constructed of:
- a polysilicon layer electrically contacting said source/drain structures to form a lower electrode of said capacitor;
- a polysilicon storage node in a series of S-shaped curves extending vertically upward from said gate structures wherein cavities exist between portions of said S-shaped curves;
- a capacitor dielectric layer over said lower electrode and conformally over all surfaces of said S-shaded curves of said storage node; and
- a top polysilicon electrode layer overlying said capacitor dielectric layer and filling said cavities formed between said S-shaped curves to complete said capacitor.

2. The memory of claim 1 wherein the thickness of said layers of polysilicon forming said storage node is between about 500 to 2000 Angstroms.

3. The memory of claim 1 wherein said capacitor dielectric is composed of layers of silicon oxide, silicon nitride and silicon oxide.

4. The memory of claim 1 wherein the thickness of said top polysilicon electrode layer is between about 1000 and 3000 Angstroms.

5. The memory of claim 4 wherein said top polysilicon electrode layer is doped.

6. The memory of claim 1 wherein said polysilicon storage node is composed of two different polysilicon layers, one of which is primary and contacts certain of said source/drain structures and the other of which is secondary and is located directly above certain of said gate structures.

* * * * *